US006967591B1

(12) United States Patent
Dwelley et al.

(10) Patent No.: US 6,967,591 B1
(45) Date of Patent: Nov. 22, 2005

(54) MULTI-BIT DIGITAL INPUT USING A SINGLE PIN

(75) Inventors: David M. Dwelley, Santa Barbara, CA (US); Robert L. Reay, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 612 days.

(21) Appl. No.: 10/124,658

(22) Filed: Apr. 15, 2002

(51) Int. Cl.[7] ............................................. G08C 19/16
(52) U.S. Cl. ..................... 340/870.21; 341/126; 713/1; 713/100
(58) Field of Search ....................... 340/870.21, 870.39; 341/126, 155; 713/1, 100; 710/72; 365/168, 365/220

(56) References Cited

U.S. PATENT DOCUMENTS

| 4,604,692 A | | 8/1986 | Murakami | 364/200 |
|---|---|---|---|---|
| 5,896,337 A | * | 4/1999 | Derner | 365/220 |
| 6,169,503 B1 | * | 1/2001 | Wong | 341/136 |
| 6,564,278 B1 | * | 5/2003 | Olson | 710/301 |

FOREIGN PATENT DOCUMENTS

WO    WO 99/43003    8/1999    ............ G11C 7/00

OTHER PUBLICATIONS

"SMBus/I₂CSC®—Compatible, 10-Bit Digital Temperature Sensors in SOT-23," AD7414/AD7415, *Analog Devices*, pp. 1-12, Jul. 2001.
"Complete Temperature Monitoring System in Tiny 5- or 6-Lead SOT-23 Packages—Introducing The AD7414/15, Low-Power, temperature sensor and 10-bit ADC Which Monitors and Digitizes Temperature Readings to 0.25° C. Resolution," *Analog Device*, News Release available at www.analog.com, Jul. 23, 2001.

* cited by examiner

*Primary Examiner*—Timothy Edwards, Jr.
(74) *Attorney, Agent, or Firm*—Fish & Neave IP Group of Ropes & Gray LLP

(57) ABSTRACT

Electronic devices, and methods, for transmitting, transferring and/or conveying a multi-bit digital signal as a voltage signal via a single pin. Devices and methods according to the invention substantially reduce the pin count of a device because inputting of a multi-bit digital signal preferably does not use more than one input pin. In addition, the speed of transmission is improved because the multi-bit digital signal is transmitted as a voltage signal substantially at one time as opposed to serially.

17 Claims, 6 Drawing Sheets

MULTI-BIT DIGITAL INPUT USING A SINGLE PIN

BACKGROUND OF THE INVENTION

A device in an electronic system may require a multi-bit digital address or number as an input. This number may represent an address on a serial bus, a configuration word, a system serial number, or some other information required by the device. Often this number is static, or changes infrequently during the operation of the device. In these circumstances—i.e., where this number is static or requires changes only infrequently—this number is typically required at device startup.

A simple way to input such a number to the device is to have several external pins, each corresponding to a bit of the input word. Each pin is tied to either a high or low value to represent the binary bits of the input word. While straightforward, this technique requires N external electrical connections, where N is the number of bits in the input word. If the device is an integrated circuit in a low-pin-count package, these input bits may consume most of the pins on the device, leaving few for other functionality. Thus, utilizing N pins, where each pin accepts one binary bit, limits the usefulness of the device and is, therefore, a sub-optimal design solution.

Alternatively, the numeric input could also be programmed into the electronic device at the time of manufacture or system assembly, or could be transferred into the device through a single pin using a serial communication protocol. However, each of these methods requires significant additional complexity in the system architecture or manufacturing process.

Thus, it would be desirable to provide circuits and methods that utilize a single pin to accept a single signal corresponding to a multi-bit digital address, number, or signal as required by the electronic device.

SUMMARY OF THE INVENTION

It is an object of this invention to provide circuits and methods that utilize a single pin to accept a single signal corresponding to a multi-bit digital address, number, or signal as required by the electronic device.

A method of configuring an electronic device via a single input pin of the electronic device is provided. The method preferably utilizes a first multi-bit digital address that was encoded as a first voltage signal. The method preferably includes receiving the first voltage signal at the single input pin of the electronic device. After the first voltage signal is received at the single input pin, the method further includes converting the first voltage signal received at the input pin into the first multi-bit digital address, and configuring the electronic device using the first multi-bit digital address.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Circuits and methods according to the invention preferably include inputting a single voltage signal, preferably via a single pin, corresponding to a multi-bit digital value. The digital value preferably includes a pre-determined number of bits.

In one embodiment, a device which utilizes circuits and methods according to the invention preferably includes a power supply connection, a ground connection, each of which are connected to the device at respective input pins, and a third input pin. Other I/O pins may also be required for the device to function according to the individual requirements of the device.

In the device according to the invention, a specific voltage is applied to the input pin. The voltage preferably corresponds, according to a pre-determined protocol, to a multi-bit digital signal. This voltage is then, in turn, converted by an analog-to-digital converter or other suitable circuitry into the multi-bit digital input signal required by the device. Thus, the signal transferred to the single input voltage at the pin sets the desired multi-bit digital input signal for the electronic device. Furthermore, according to the invention, each of the several bits, which are encoded within the voltage signal, are programmed into the device substantially simultaneously, thereby reducing the time to program the multi-bit digital input signal.

The desired multi-bit digital input signal may be represented at the input to the device by a voltage which is a pre-determined, preferably fixed, fraction or ratio of the total power supply voltage, or it may be referenced to an absolute voltage standard or reference. This fraction or ratio may be converted into the required multi-bit digital input signal. Further details of the invention will be explained below with respect to FIGS. 1–5.

Figure 1:
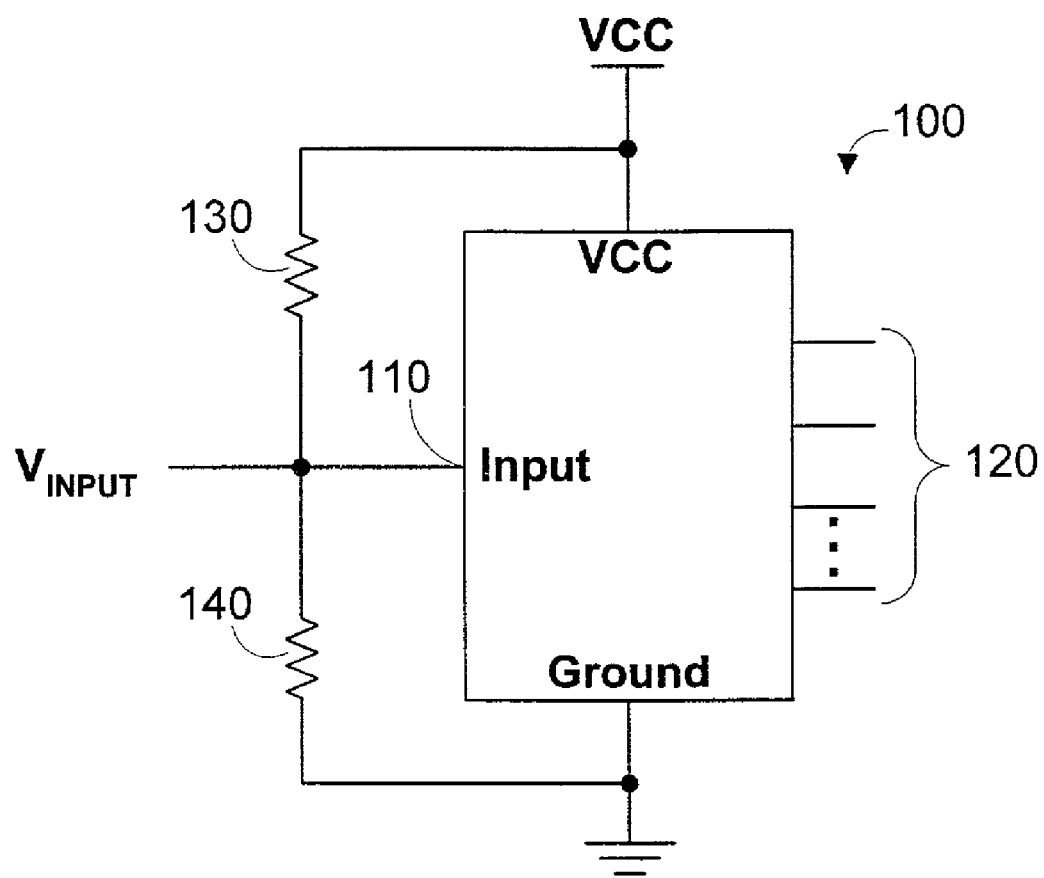
FIG. 1 is a schematic diagram of a circuit according to the invention.

FIG. 1 shows an embodiment of a device 100 according to the invention that includes a power supply, Vcc, a ground pin and an input pin 110. Device 100 may also include other I/O pins 120 for transmitting digital or analog signals either to or from device 100 as required by device 100.

The input voltage at input pin 110 is preferably programmed by the value of the resistors 130 and 140 because these resistors function as a voltage divider that provides a voltage that is some known portion of Vcc. The resistor values should preferably be chosen such that the voltage at input pin 110 is a fixed percentage of the voltage between the Vcc and ground pins.

Figure 2A:
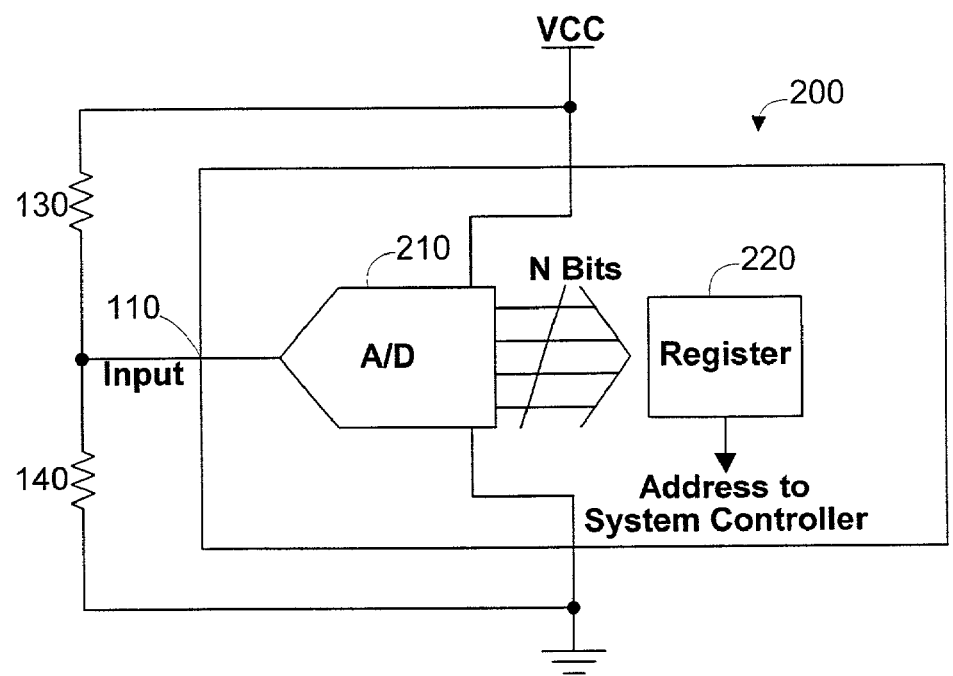
FIG. 2A is a schematic diagram of a circuit according to the invention including an analog-to-digital converter according to the invention.
Figure 2B:
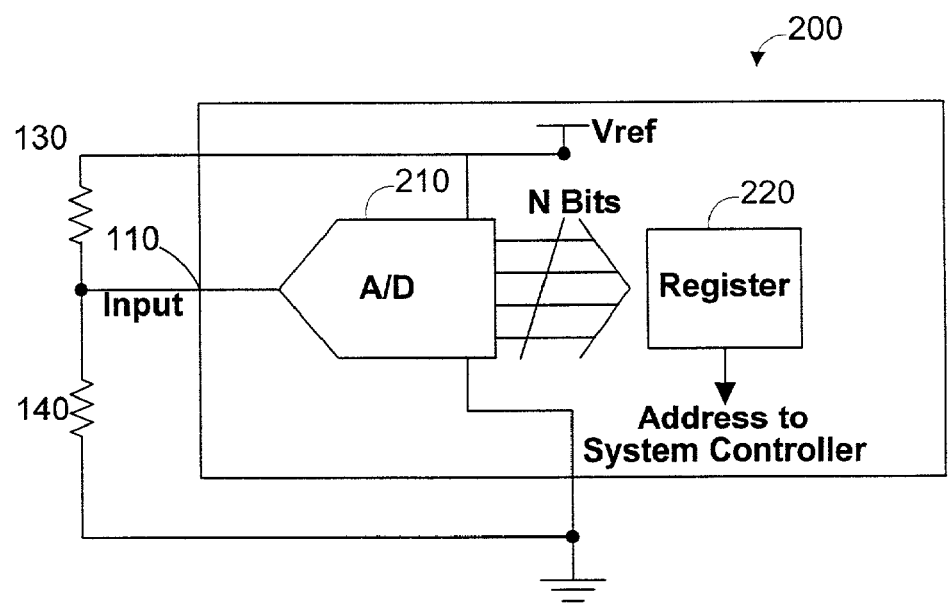
FIG. 2B is a schematic diagram of a circuit according to the invention including an analog-to-digital converter having an internal voltage reference according to the invention.

Device 100 may be utilized in a device that requires a 2-bit digital number as an input. In such a system, "00" may preferably correspond to an input voltage between 0% and 25% of the power-to-ground voltage, "01" may preferably correspond to an input voltage between 25% to 50%, "10" to 50% to 75%, and "11" to 75% to 100%. The determination of the range of percentages in which the voltage falls may preferably be obtained using a number or group of different comparators (not shown) in the electronic device, as is known in the art, in order to accurately determine the value (or range) of the incoming voltage. Once the value (or range) is determined, it may then be transferred as a single voltage—e.g., from the midpoint of the range—to an analog-to-digital converter (as shown in FIGS. 2A and 2B) in order to derive the multi-bit digital address.

This concept can be extended to almost any number of percentages, numbers and/or steps, with the limit set by the accuracy of the internal sensing scheme. The limit may also be set by the available values and precision of resistors 130 and 140. In an alternative to a fixed input voltage, resistors 130 and 140 may preferably be implemented as variable resistors with the levels of variation determined by the required number of bits in the multi-bit digital input value (or binary number).

The voltage ranges at the input pin that correspond to individual digital values can be evenly sized and spaced across the available voltage range. Alternatively, the voltage ranges at the input pin can have unequal sizes and spaces.

Equal-sized/spaced ranges ease calculation of error tolerances and are conceptually simpler. With an equal-sized scheme, conventional 10% margin-for-error resistors may be used to generate 2 input bits or 4 possible numeric inputs (as described above with respect to FIG. 1) without the risk of resistor tolerance error causing a false input reading. 1% error resistors may be used to generate 5 bits or 32 possible inputs, and 0.1% resistors may be used to generate up to 8 bits or 256 inputs.

Unequal-sized/spaced ranges can also be used to simplify the choice of external resistor values. This may be accomplished by choosing the range of the resistors so that a resistor divider is used with two fixed resistors or with one resistor value fixed and one resistor value varying in a linear manner may be used to select the desired input. The resistor value may preferably vary, or be adjustable, in known incremental values. Or, in an alternative embodiment, the resistor value may vary, or be adjustable, in a smoothed fashion.

It is possible that noise at the input pin or at the power supplies can cause intermittent erroneous readings, especially when several bits are being programmed and the separation between adjacent steps is small. Additional circuitry can be added to take multiple readings at the input pin, and either arithmetically average the readings or require a sequence of several identical readings before a valid input is recognized. Circuitry to implement additional readings and/or averaging will be shown in detail below with respect to FIGS. 3 and 4.

FIG. 2A shows another embodiment of the invention in which device 200 may communicate over a serial digital interface bus, such as an I$^2$C bus made by Phillips Electronics of the Netherlands, and notifies and/or identifies the central processing unit of a unique address to write data to, to transmit data from, or to configure device 200. The selected address that should be identified to receive and/or transmit the signal may be programmed as a resistor-divided voltage into resistors 130 and 140. The relative resistor sizes and, thus, the input voltage, may be selected by a user as required by an individual design.

In one embodiment of the invention, the resistors may be individually chosen for each of a set of components along a serial bus—e.g., a fan control chip, a voltage monitor device for a battery or a device to control contrast for a screen voltage monitor—such that each component receives a preferably user-determined, unique voltage which may then be converted into a digital address as the device's unique address. This voltage may identify the device to the device itself by a particular address. This identity may be static for the operative cycle—i.e., as long as the chip is powered up—of the chip. When a microcontroller or other suitable processor uses the serial bus to communicate with the devices along the bus during operation of the chip, the microcontroller may refer to the device by the address identified to the device by the choice of resistors in the resistor divider. This embodiment obtains the advantage that each of the devices on the serial bus may be identified by resistor choice as opposed to assigning each chip a unique design. Thus, the chip manufacturer may be able to produce a single chip to fit various system requirements—e.g., various voltage levels as required by differing systems. The chip is then customized by the individual user merely by adding resistors as required by his system requirements.

For example, a single fan control chip may be implemented in systems where the fan may use different addresses. These different addresses may be identified in each individual system according to the resistor choice of the user. Therefore, the fan chip maker requires only a single chip and his inventory, as well as the inventory of a user with various systems, is substantially simplified.

As described above, one or both of resistors 130 and 140 may be variable so that different identifiable addresses, in the form of different analog voltages, may be transmitted into the device at the single input pin. Alternatively, the input voltage may be varied in another suitable fashion to provide different digital addresses.

Electronic device 200 preferably requires internal circuitry to convert the voltage at the input pin into a digital address. This circuitry may be implemented in a number of suitable ways.

Device 200 may preferably include analog-to-digital converter 210 to convert the voltage at the input pin into a digital value. Analog-to-digital converter 210 may preferably have sufficient resolution that it can be set to accurately read and convert the voltage at the input pin. Analog-to-digital converter 210 may also be coupled to register 220. Register 220 may preferably store the resulting value for later comparison with other incoming address words or for transferring the value to a system controller (not shown).

Analog-to-digital converter 210 may also preferably be coupled between Vcc and ground such that the scale of digital addresses produced by analog-to-digital converter 210 varies proportionally to changes in Vcc. This is required because Vcc may change during the operation of device 200 and alter the voltage seen by input pin 110. When analog-to-digital converter 210 is bound by Vcc and ground in this way, the digital addresses that analog-to-digital converter 210 provides are accurate even though Vcc may change.

Once device 200 has received the input voltage and converted it into a multi-bit digital value, it may use this value to identify an address in device 200. When this address is identified, device 200 may perform any suitable action with the address. Examples of such suitable actions are the outputting of the value stored at the identified address to another portion of device 200, or even outputting the value off device 200 to another device. Alternatively, the address and/or the value at the address may be stored for later use or reference.

In a device that uses a serial bus, bits and/or addresses are often shifted into a register prior to the time when the device is required to recognize the address. When a serial bus, such as the I$^2$C bus, is used, the components that are coupled to the bus require a unique address in order to interpret the communication from the bus. The address allows the component to be alerted when a communication directed to the component is being transmitted along the bus. The microcontroller first transfers the address along the bus. Then, the microcontroller transfers the information. In FIG. 2, the address for the particular component may be communicated to electronic device 200 via input pin 110 by the resistor divider formed by resistors 130 and 140. Thus, when the supply voltage is high and the resistor divider is turned ON, the voltage configured by the resistor divider addresses electronic device 200. Once addressed, electronic device 200 may be prepared to accept communication from the microcontroller.

In another alternative embodiment, the address may be used as a configuration word to configure device 200 in some suitable fashion—e.g., to inform device 200 that it should act as memory device, a signal processor, any other suitable device, or to inform device 200 that is has a particular address to be on alert for when instructions are generated from the serial bus. The foregoing are only examples of the use of the identified address, and the value located therein, and are not meant to be exhaustive or to limit the scope of the invention with respect to the use of the multi-bit digital value derived from the input voltage.

Analog-to-digital converter 210 may also preferably be coupled between Vcc and ground such that the scale of digital addresses produced by analog-to-digital converter 210 remains independent of changes in Vcc. The scale of digital addresses is independent because it also is based on an analog scale that uses as a high (or low) end reference voltage. This extra functionality is required because Vcc may change during the operation of device 200 and alter the voltage seen by input pin 110. When analog-to-digital converter 210 is bound by reference voltage Vcc and ground in this way, the digital addresses that analog-to-digital converter 210 provides are maintained accurately even though Vcc may change.

FIG. 2B shows another embodiment of a device 250 according to the invention. The main difference between device 200 and device 250 is that the reference voltage for analog-to-digital converter 210, and for the resistor-divider including resistors 130 and 140, is generated externally in device 200 and internally in device 250. Generating the reference voltage internally mitigates the error that occurs in device 200 between the mismatching of capacitances generated at input pin 110 and at the coupling of Vcc to analog-to-digital converter 210.

In another embodiment of the invention, device 200 shown in FIG. 2A or 2B may be configured as an analog voltage monitor. One purpose of a voltage monitor may be to determine whether a voltage at a particular I/O pin, or an internal voltage, is below, at, or above a pre-determined voltage or range of voltages. This function may be accomplished using a voltage monitor.

In the circuit shown in FIG. 2, the input at pin 110 may be a pre-determined voltage. This voltage is preferably converted into a digital address by analog-to-digital converter 210. Then, the digital address may be stored in register 220 and finally transferred or conveyed to the system controller. According to this embodiment of the invention, the stored value may be used to configure the voltage monitor. One aspect of the configuration may be to define the voltage level, or range of levels, of the monitor. Thus, device 200 may be configured to perform different functions, or to perform the same function—i.e., to monitor voltage—at different levels or ranges of levels. These different levels or ranges of levels are typically referred to as the trip level or levels of the voltage monitor.

Figure 3:
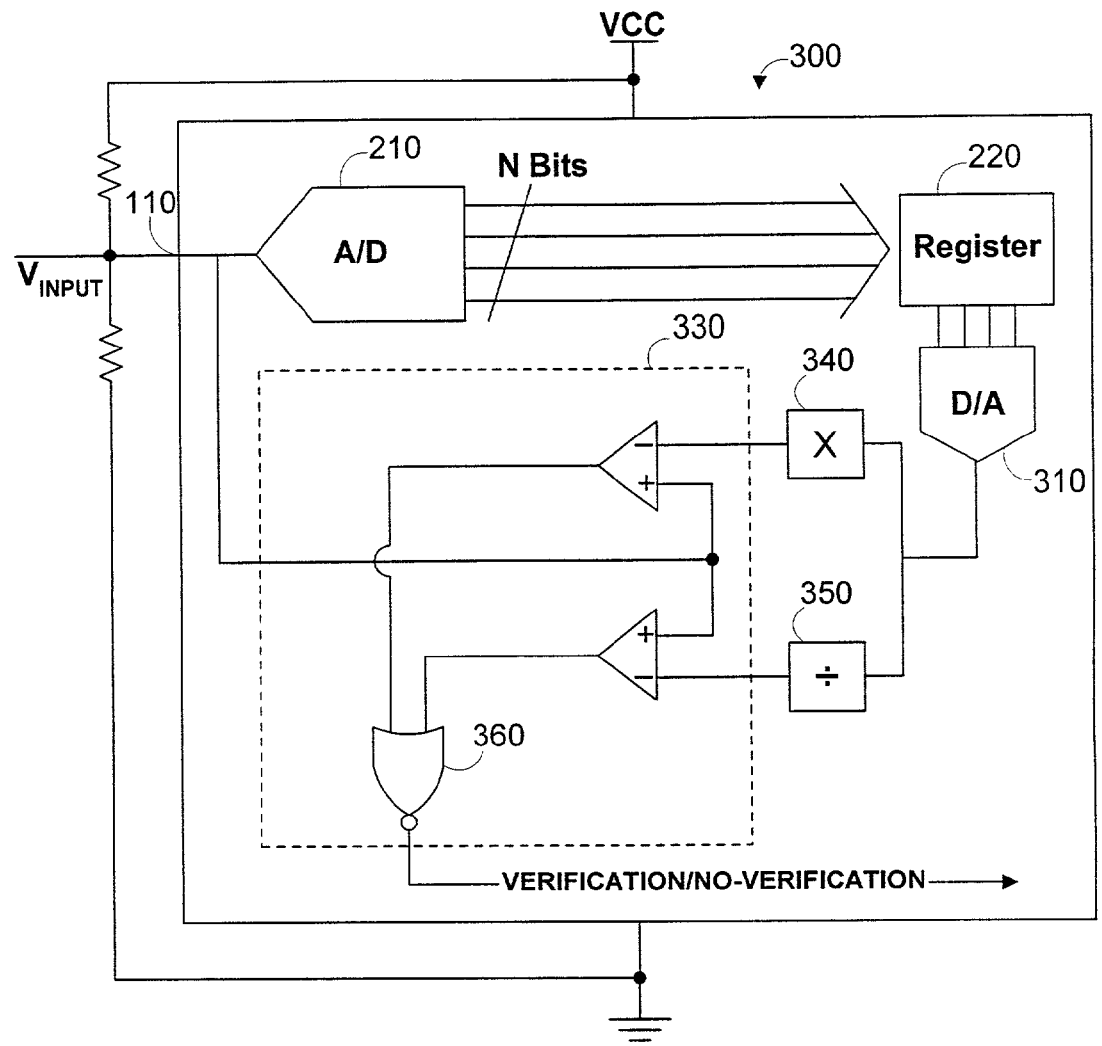
FIG. 3 is a schematic diagram of a circuit according to the invention that verifies the input voltage.

FIG. 3 shows another embodiment of a device 300 according to the invention. This embodiment may be used to sample the input voltage multiple times and to validate the address provided by the multiple samples. This embodiment is particularly advantageous in a system that uses a serial bus and requires the identification of an address.

Device 300 preferably includes additional components such as a digital-to-analog converter 310 for re-converting the digital address stored in the register 220 into a voltage, and a window comparator 330 for determining whether the two representative voltages, and, consequentially, the two derived digital values, are substantially the same.

Device 300 preferably operates as follows. When a first voltage is applied to input pin 110, this voltage may preferably be converted by analog-to-digital converter 210 to a digital address. This digital address may preferably be stored in register 220. When the digital address is required for a comparison to a new input voltage, the digital address stored in register 220 may be output to digital-to-analog converter 310.

Then, the voltage from converter 310 may be conveyed to a window comparator 330. The references values, Vref1 and Vref2, for the window comparator may preferably be obtained by converting the stored digital value into an analog voltage and proportionally adjusting the re-converted analog voltage up and down by some pre-determined fraction—e.g., by voltage multiplier 340 and voltage divider 350—to form a voltage range between the higher and the lower voltage values about the voltage from digital-to-analog converter 310. These two voltages may then be used to set a comparison range or "window" in which a second input voltage may be verified. This window is preferably small enough such that the acceptance level of window comparator 330 is narrower than the separation between adjacent input levels. In this particular embodiment of the invention, XOR gate 360 may preferably provide a high signal when the second voltage is within the verification window (or validation) window.

Prior to the input of the second analog voltage, the output of digital-to-analog converter 310 may preferably be set such that the first voltage is not validated against the start-up output of digital-to-analog converter 210. Therefore, window comparator 330 preferably provides an "invalid" output after device 300 receives the initial voltage because the input from input pin 110 does not match the input from register 220 via digital-to-analog converter 310. The "invalid" output indicates that the input voltage signal has not been verified by being matched to the previously input voltage signal. Thereafter, the input value from analog-to-digital converter 210 is stored in register 220.

When a second voltage is applied to input pin 110, the second voltage may be compared to the range established by up-multiplier 340 and down-divider 350. This comparison validates the first and second voltage signals, and, consequently the first and second digital signals. Preferably, this comparison should be implemented in accordance with a suitable timing scheme such that the second signal does not overwrite the first signal in register 220 before the comparison is made.

If the two addresses are substantially the same, then window comparator may preferably output a "valid" response—i.e., the input voltage has been verified. Device 300 may preferably utilize the address either as derived from the analog-to-digital converter 210 and/or from register 220 because, after the voltages have been validated, both of these values are substantially the same.

The process of validating the input voltage, and, consequently, the input address, may be repeated as many times as necessary to insure correct signal transmission and reception.

Thus, device 300 may preferably provide a pass/no-pass comparison of the multi-bit digital signal (or address word) without requiring an analog-to-digital conversion of the incoming signal followed by an arithmetic comparison. It should be noted that a circuit including window comparator 330 is only one embodiment of a circuit for validating the incoming voltage signal. Other suitable circuitry or methodology may be used for this function.

Alternatively, the comparison may be implemented by comparing the first digital signal output from register 220 to a digital signal output from analog-to-digital converter 210 using a digital comparator. These digital signals may be compared when the timing of the output of register 220 coincides with the timing of the output of analog-to-digital converter 210.

Figure 4:
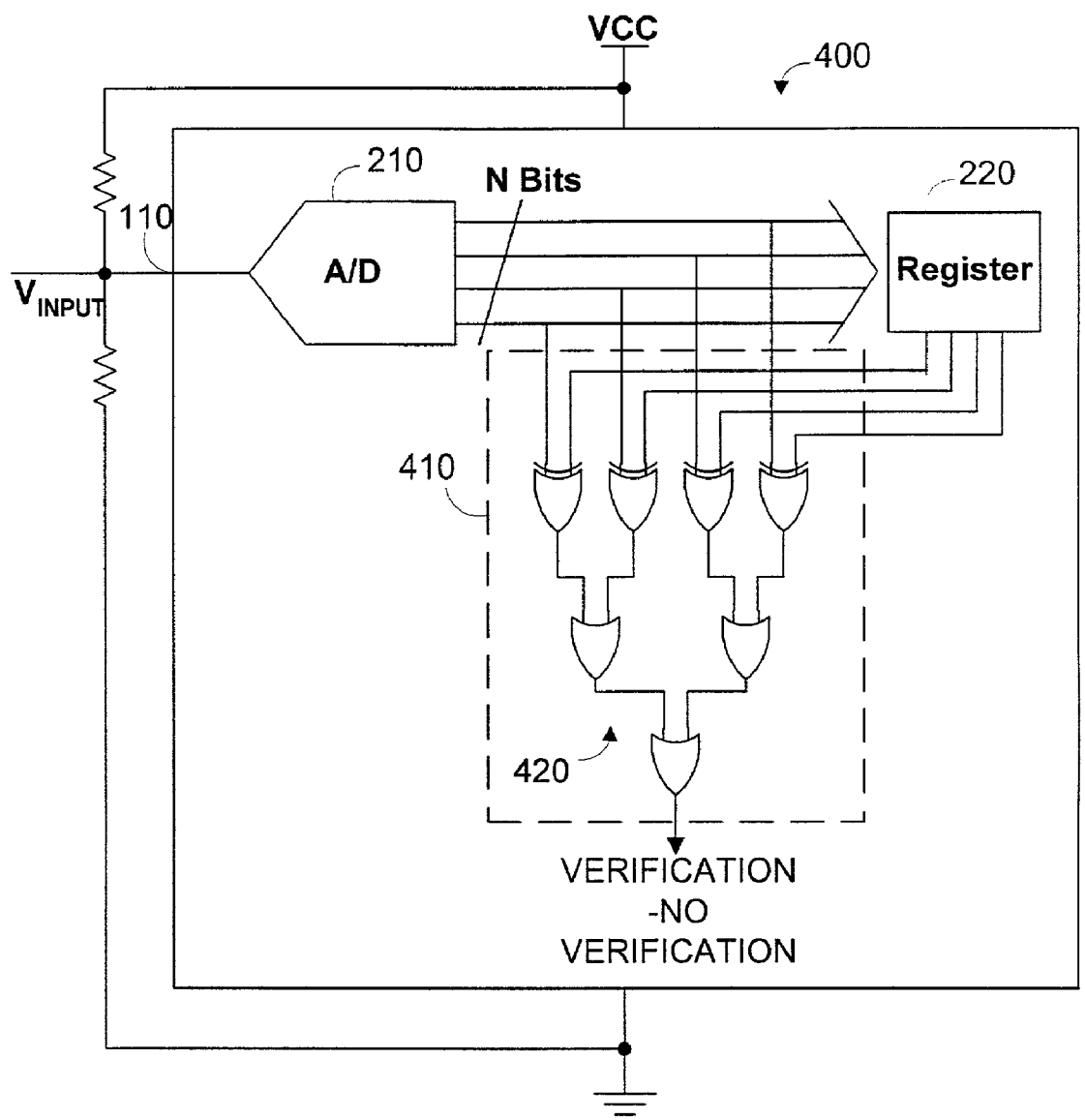
FIG. 4 is a schematic diagram of a circuit according to the invention including a digital comparator.
Figure 5:
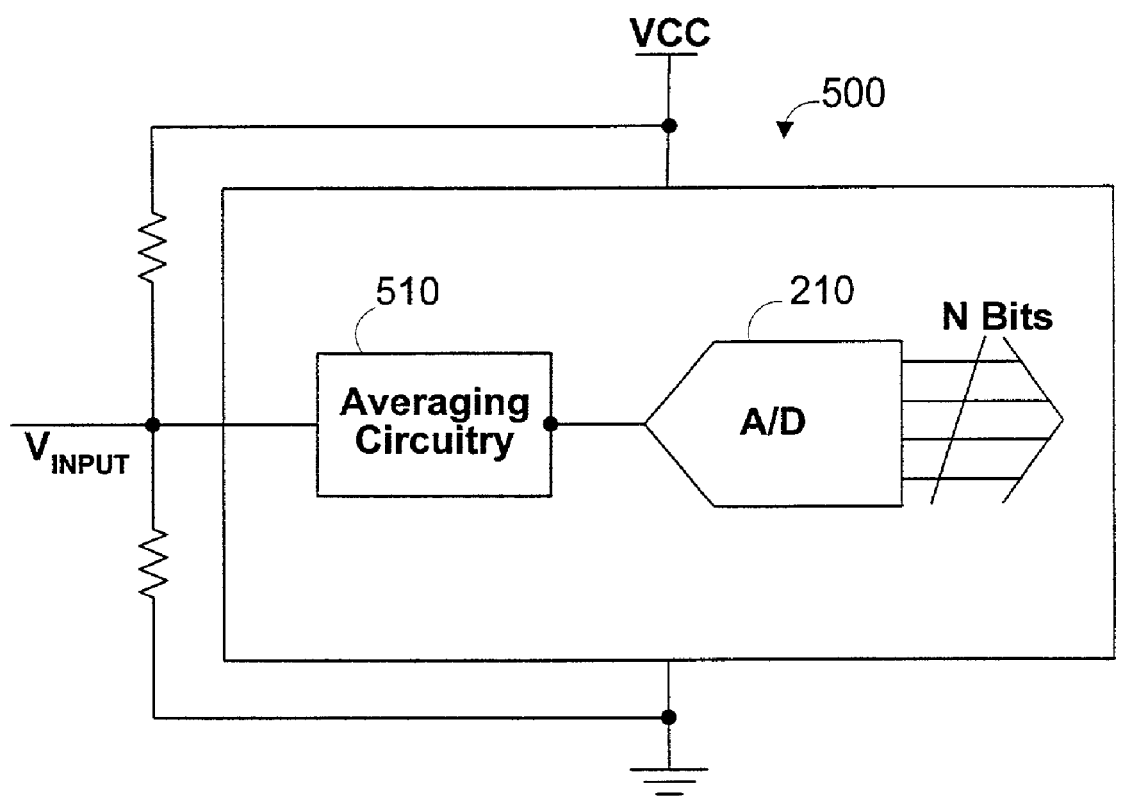
FIG. 5 is a schematic diagram of a circuit according to the invention including an averaging circuit.
Figure 6:
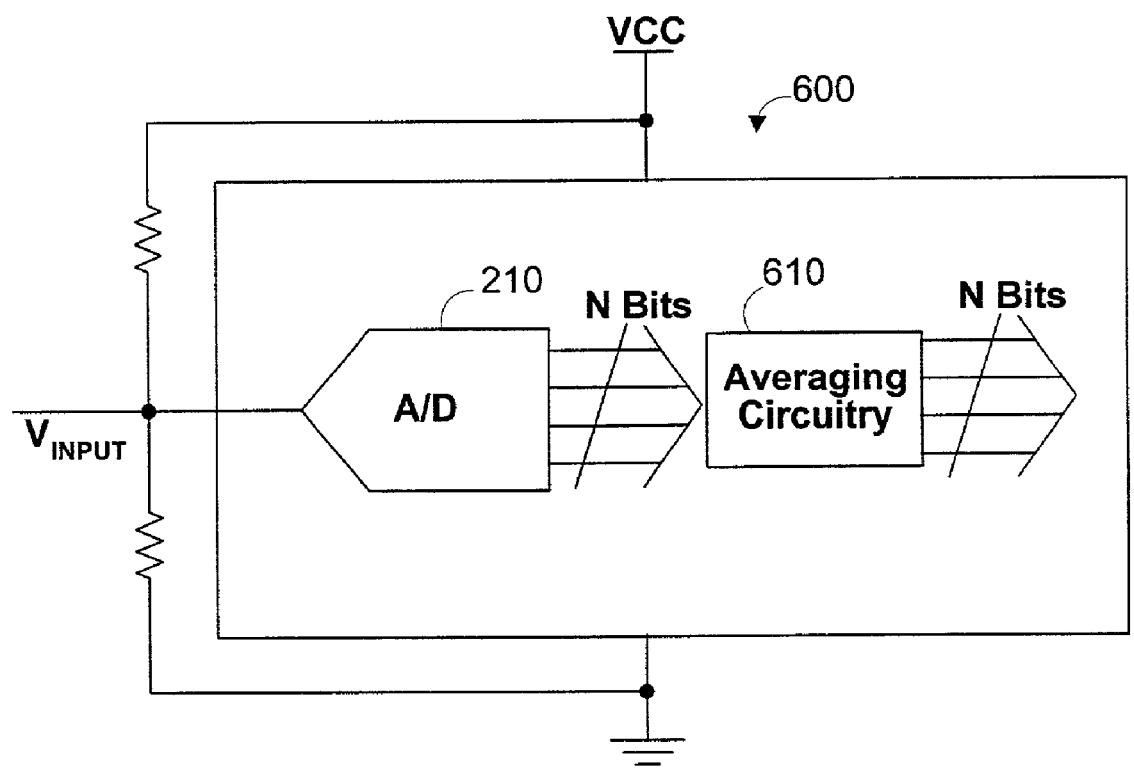
FIG. 6 is another schematic diagram of a circuit according to the invention including an averaging circuit.

One possible implementation of a circuit implementing a digital comparator that is suitable for comparing the two digital signals is shown in FIG. 4. Digital comparator 410, which preferably includes XOR and OR logic gates 420, may preferably be implemented to compare the output of analog-to-digital converter 210 with the output of register 220. As mentioned above, a suitable timing scheme is required for implementation of digital comparator 410.

In an alternative embodiment, circuit 500 shows averaging circuitry 510. Averaging circuitry 510 preferably receives a pre-determined number of voltage values, averages the values, and derives an average voltage. This voltage may then be converted into a digital value by analog-to-digital converter 210. This digital value may be used similarly to the digital values described above. Preferably the averaging circuitry provides the corrected voltage to the rest of the circuitry.

The actual averaging function of averaging circuitry 510 may be implemented in a suitable fashion as is well known to those skilled in the art.

In yet another alternative embodiment, circuit 600 shows averaging circuitry 610. Averaging circuitry 610 preferably receives a pre-determined number of digital addresses, averages the addresses, and derives an average. This digital address may be used similarly to the digital values described above.

The actual averaging function of averaging circuitry 610 may be implemented in a suitable fashion as is well known to those skilled in the art. In another embodiment, circuitry 610 may be implemented as a register that, instead of averaging, stores three values. When any difference between the values is detected, the registers clears the values and starts storing the values again. An output is transmitted only when all three values match.

Thus, electronic devices and methods for transmitting a multi-bit digital signal via a single pin are provided. Persons skilled in the art will appreciate that the present invention can be practiced by other than the described embodiments, which are presented for purposes of illustration rather than of limitation, and the present invention is limited only by the claims which follow.

What is claimed is:

1. A method of configuring an electronic device using a first multi-bit digital address, the first multi-bit digital address being encoded as a first voltage signal, the method comprising:

receiving the first voltage signal at a single input pin of the electronic device;

after the first voltage signal is received at the single input pin, converting the first voltage signal received at the input pin into the first multi-bit digital address; and configuring the electronic device as a voltage monitor using the first multi-bit digital address.

2. The method of claim 1 further comprising maintaining the device as responsive to a bus communication signal following a transmission of a bus address signal including the first multi-bit digital address.

3. The method of claim 1 further comprising:

receiving a second multi-bit digital address that has been encoded as a second voltage signal at the first input pin or at a second input pin;

converting the second voltage signal to obtain a verification address; and verifying the verification address by comparing the first multi-bit digital address to the verification address.

4. The method of claim 1 further comprising:

receiving a second voltage signal at the first input pin or a second input pin;

converting the second voltage signal into a verification voltage range; and determining whether the first voltage signal is within the verification voltage range.

5. The method of claim 1, the converting further comprising converting integrally to the electronic device.

6. The method of claim 1, the configuring further comprising configuring the trip points of the voltage monitor using the first digital address.

7. The method of claim 1 further comprising referencing the converting to a reference value that is substantially equal to a reference value used to encode the first multi-bit digital signal as the first voltage signal.

8. A method of configuring an electronic device to receive communication signals from a serial bus, the configuring using a first multi-bit digital signal, the first multi-bit digital signal being encoded as a first voltage signal, the method comprising:

receiving the first voltage signal at a single pin of the electronic device;

after the first voltage signal is received at the single input pin, converting the first voltage signal into the first multi-bit digital signal, the converting comprising maintaining the accuracy of the converting with respect to changes in a supply voltage of the device across the operational range of the electronic device; and maintaining the device as responsive to the communications signals from the serial bus that follow transmission of the first multi-bit digital signal on the bus.

9. The method of claim 8 further comprising encoding the first multi-bit digital signal as a pre-determined portion of a supply voltage of the electronic device.

10. The method of claim 8 further comprising providing a reference voltage on the electronic device, and encoding the first multi-bit digital signal as a pre-determined portion of the reference voltage.

11. A voltage monitor comprising:

an input pin that receives a first input voltage signal;

a first converter circuit coupled to the input pin, the first converter circuit that converts the first voltage signal into a first digital address;

a storage circuit coupled to the first converter circuit, the storage circuit that stores the first digital address;

a second converter circuit that re-converts the first digital address into the first voltage;

a comparator circuit coupled to the input pin and to the storage circuit, the comparator circuit that compares the first voltage to a second input voltage and configures the voltage monitor based on the comparison.

12. The electronic device of claim 11 wherein the first converter circuit comprises an analog-to-digital converter circuit.

13. The electronic device of claim 11 wherein the second converter circuit comprises a digital-to-analog converter circuit.

14. The electronic device of claim 11 wherein the storage circuit comprises a register.

15. The electronic device of claim 11 wherein the comparator circuit comprises a window comparator circuit.

16. The electronic device of claim 15 wherein the window comparator circuit is adapted to have an acceptance level that is narrower than the separation between adjacent input levels.

17. The electronic device of claim 15 wherein the window comparator is adapted to compare the first voltage signal to the second voltage signal with a level of greater accuracy than the accuracy of the least significant bit of the first multi-bit digital signal.

* * * * *